(12) United States Patent
Liu et al.

(10) Patent No.: US 10,985,113 B2
(45) Date of Patent: Apr. 20, 2021

(54) DISPLAY SUBSTRATE, DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Wei Liu, Beijing (CN); Zhiliang Jiang, Beijing (CN); Zhenli Zhou, Beijing (CN); Xiaoling Luo, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/651,495

(22) PCT Filed: Sep. 6, 2019

(86) PCT No.: PCT/CN2019/104768
§ 371 (c)(1),
(2) Date: Mar. 27, 2020

(87) PCT Pub. No.: WO2020/073760
PCT Pub. Date: Apr. 16, 2020

(65) Prior Publication Data
US 2020/0273816 A1 Aug. 27, 2020

(30) Foreign Application Priority Data
Oct. 9, 2018 (CN) .......................... 201811172985.0

(51) Int. Cl.
*H01L 23/00* (2006.01)
*H01L 27/12* (2006.01)

(52) U.S. Cl.
CPC ........ *H01L 23/562* (2013.01); *H01L 27/1248* (2013.01)

(58) Field of Classification Search
None
See application file for complete search history.

(56) References Cited

U.S. PATENT DOCUMENTS

2001/0000437 A1* 4/2001 Tanaka .............. G02F 1/133512
349/110
2015/0034935 A1 2/2015 Choi
(Continued)

FOREIGN PATENT DOCUMENTS

CN 205539852 U 8/2016
CN 106848107 A 6/2017
(Continued)

OTHER PUBLICATIONS

Office Action for corresponding Chinese Application(201811172985.0) dated Sep. 20, 2019.

*Primary Examiner* — Bo B Jang
(74) *Attorney, Agent, or Firm* — Arent Fox LLP; Michael Fainberg

(57) ABSTRACT

The present disclosure discloses a display substrate, a display panel, and a display device. The display substrate includes: a base, and a device layer and an insulation layer on the base. The base includes a display area and a non-display area located on a peripheral side of the display area. At least one blocking dam is provided in a portion, located on the non-display area, of the insulation layer, and each blocking dam corresponds to an edge portion of one side edge of the base. In each edge portion of a side edge corresponding to a blocking dam, the blocking dam includes a plurality of blocking strips arranged along an extension direction of the side edge, an extension direction of each blocking strip is perpendicular to the side edge, and each
(Continued)

blocking strip has a zigzag structure extending along a direction perpendicular to the side edge.

20 Claims, 2 Drawing Sheets

(56) References Cited

U.S. PATENT DOCUMENTS

| | | |
|---|---|---|
| 2016/0284770 A1 | 9/2016 | Kim |
| 2018/0061910 A1 | 3/2018 | Cai |
| 2018/0196290 A1 | 7/2018 | Li et al. |
| 2020/0273816 A1 | 8/2020 | Liu et al. |

FOREIGN PATENT DOCUMENTS

| | | |
|---|---|---|
| CN | 107068715 A | 8/2017 |
| CN | 107705710 A | 2/2018 |
| CN | 107863376 A | 3/2018 |
| CN | 207637803 U | 7/2018 |
| CN | 207896125 U | 9/2018 |
| CN | 109166459 A | 1/2019 |
| KR | 20170038984 A | 4/2017 |

* cited by examiner

DISPLAY SUBSTRATE, DISPLAY PANEL AND DISPLAY DEVICE

The present application is a national stage application of International Application No. PCT/CN2019/104768, filed Sep. 6, 2019, which claims priority from Chinese Patent Application No. 201811172985.0, filed with the Chinese Patent Office on Oct. 9, 2018 and entitled "Display Substrate, Display Panel and Display Device", both of which are hereby incorporated by reference in their entireties.

FIELD

The present disclosure relates to the technical field of display, and particularly to a display substrate, a display panel, and a display device.

BACKGROUND

In the related art, after a screen is cut to form a plurality of panels, cracks caused by external force will occur to the panels when they are taken, placed and transferred. At present, in order to prevent cracks from occurring and expanding, several blocking structures (as shown in FIG. 1) parallel to the edges of the panels are usually set in interlayer insulation layers and gate insulation layers, but product analysis results show that there are still many cracks generated, and some cracks even penetrate all the blocking structures and affect the panel display.

SUMMARY

The present disclosure provides a display substrate, a display panel, and a display device. In the display substrate, blocking strips having zigzag structures can effectively alleviate the occurrence of cracks on peripheral surfaces of the display substrate caused by external force during cutting, fetching-placing or transferring processes, and effectively prevent cracks from expanding and improve the display quality of the panel when the external force is large.

To achieve the above object, the present disclosure provides the following technical solutions.

The display substrate includes a base, and a device layer and an insulation layer on the base. The base includes a display area and a non-display area located on a peripheral side of the display area.

At least one blocking dam is provided in a portion, located on the non-display area, of the insulation layer, and each blocking dam corresponds to an edge portion of a side edge of the base. In each edge portion of a side edge corresponding to a blocking dam, the blocking dam includes a plurality of blocking strips arranged along an extension direction of the side edge, an extension direction of each blocking strip is perpendicular to the side edge, and each blocking strip has a zigzag structure extending along a direction perpendicular to the side edge.

Optionally, a size of each blocking strip in the direction perpendicular to the side edge is 40 μm to 60 μm.

Optionally, orthographic projections of every two adjacent blocking strips, on a plane perpendicular to the base and parallel to an arrangement direction of the blocking strips, partially overlap.

Optionally, each zigzag structure includes at least one "S"-shaped unit strip, each "S"-shaped unit strip includes a first end and a second end. When a zigzag structure includes a plurality of "S"-shaped unit strips, the second end of the previous "S"-shaped unit strip is connected to the first end of the subsequent "S"-shaped unit strip along the extension direction of the blocking strips.

Optionally, each zigzag structure includes at least one "V"-shaped unit strip, each "V"-shaped unit strip includes a first free end and a second free end. When a zigzag structure includes a plurality of "V"-shaped unit strips, the second free end of the previous "V"-shaped unit strip is connected to the first free end of the subsequent "V"-shaped unit strip along the extension direction of the blocking strips.

Optionally, an angle formed by two oblique sides in the "V"-shaped unit strip is 90° to 120°.

Optionally, in the base, edge portions of each of every two opposite side edges are provided with the blocking dams.

Optionally, the blocking strips are evenly spaced.

The present disclosure also provides a display panel including any one of the display substrates provided in the above technical solutions.

The present disclosure also provides a display device including any one of the display panels provided in the above technical solutions.

DETAILED DESCRIPTION OF THE EMBODIMENTS

In the following, the technical solutions in the embodiments of the present disclosure will be clearly and completely described with reference to the drawings in the embodiments of the present disclosure. Obviously, the described embodiments are only a part of the embodiments of the present disclosure, but not all of the embodiments. Based on the embodiments of the present disclosure, all other embodiments obtained by those skilled in the art without inventive efforts shall fall within the protection scope of the present disclosure.

Figure 1:
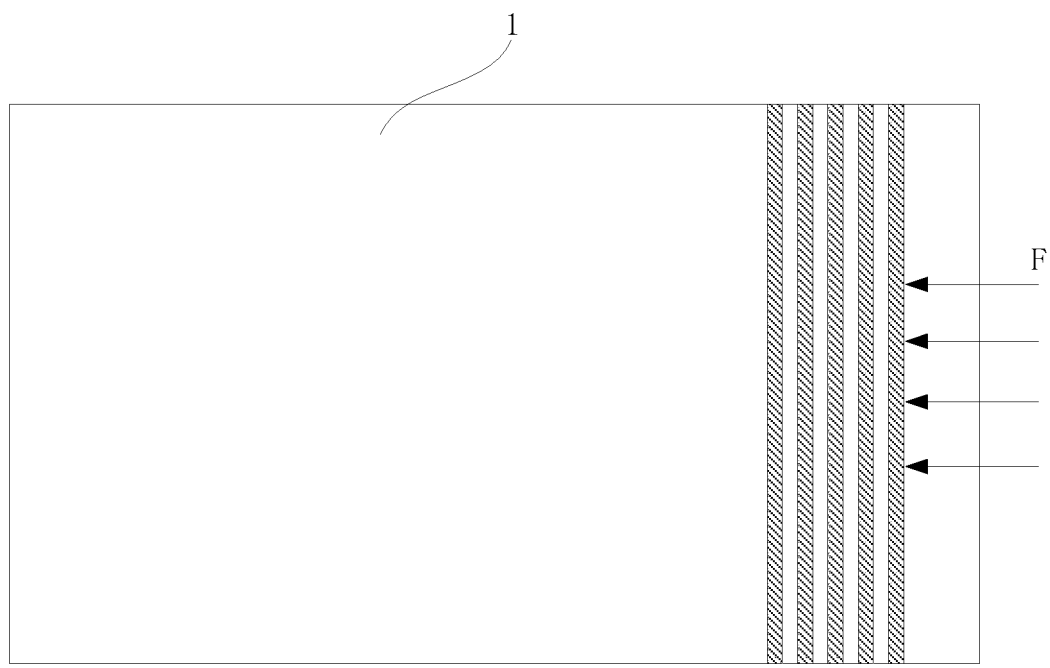
FIG. 1 is a schematic diagram of blocking structures in a display panel in the prior art.
Figure 2:
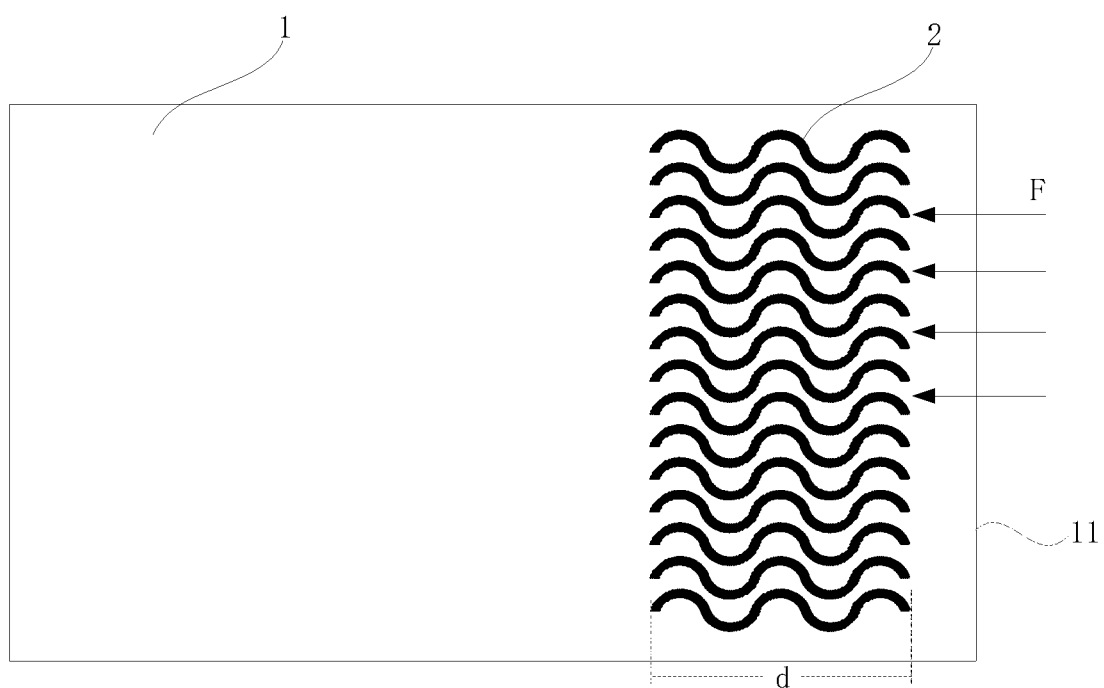
FIG. 2 is a structural schematic diagram of a zigzag structure in a design of a blocking strip according to an embodiment of the present disclosure.
Figure 4:
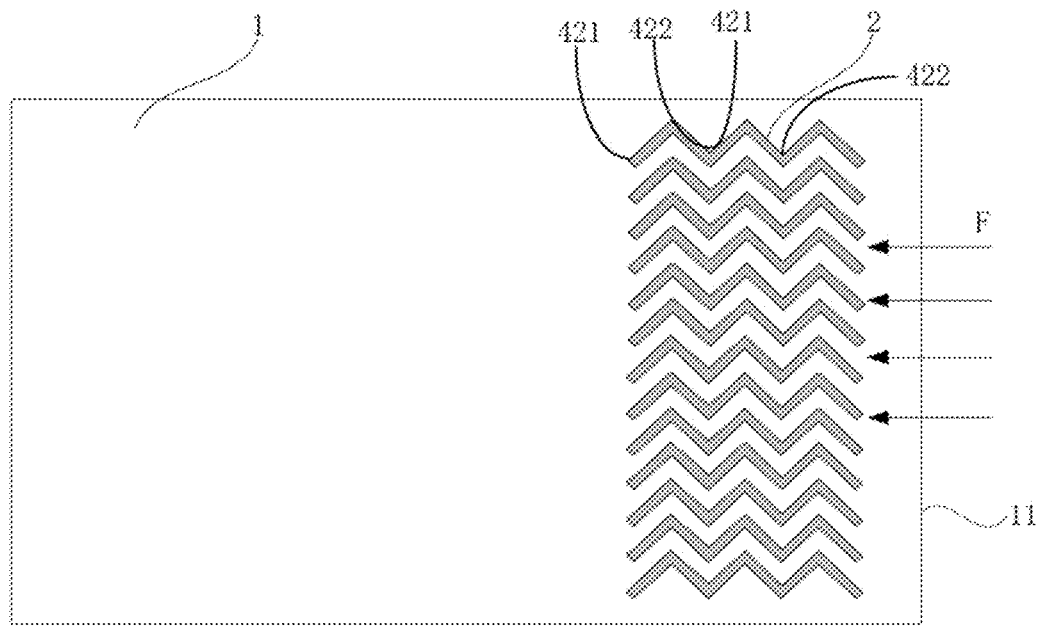
FIG. 4 is a structural schematic diagram of a zigzag structure in another design of a blocking strip according to an embodiment of the present disclosure.
Figure 6:
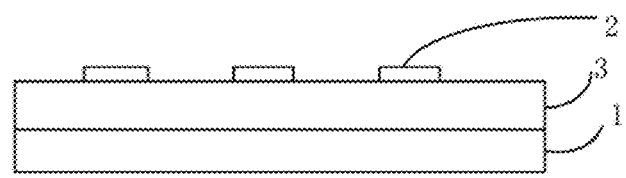
FIG. 6 is a cross-section view of a display substrate along the A-A line of FIG. 2.

Please refer to FIG. 2, FIG. 4, and FIG. 6, a display substrate provided by an embodiment of the present disclosure includes a base 1, and a device layer and an insulation layer 3 on the base 1. The base 1 includes a display area and a non-display area located on a peripheral side of the display area.

At least one blocking dam is provided in a portion, located on the non-display area, of the insulation layer 3, and each blocking dam corresponds to an edge portion of one side edge of the base 1. That is, each blocking dam is located on the edge portion of the side edge 11 of the base 1. Specifically, in each edge portion of a side edge 11 corresponding to a blocking dam, the blocking dam includes a plurality of blocking strips 2, arranged along an extension direction of the side edge 11 and each extended in a direction perpendicular to the side edge 11, and each blocking strip 2 has a zigzag structure extending along the direction perpendicular to the side edge 11. "A zigzag structure extending along the direction perpendicular to the side edge 11" refers to that a plurality of teeth of the zigzag structure are arranged along the direction perpendicular to the side edge 11, and the raised direction of each tooth intersects with the arrangement direction of the teeth.

In the above display substrate, the blocking dam(s) is/are provided in the portion, corresponding to the non-display area of the base 1, in the insulation layer, and each blocking dam corresponds to the edge portion of the side edge 11 of the base 1, and includes a plurality of blocking strips 2 whose extension directions are perpendicular to the side edges 11 of base 1. Each blocking strip 2 has the zigzag structure extending along the direction perpendicular to the side edges 11. When the side surface of the display substrate is subjected to external force perpendicular to the side surface, the surfaces of the blocking strips 2 facing the external force form contact surfaces in contact with the external force. Since each blocking strip 2 has the zigzag structure, the contact surface of the blocking strip 2 facing the external force is a surface that is not perpendicular to the external force, that is, the direction of the external force and the contact surface of the blocking strip 2 are not perpendicular. When external force is applied to the blocking strips 2, it is easy to know from the mechanical knowledge that the external force will be decomposed into a perpendicular component of force perpendicular to the contact surfaces of the blocking strips 2 and a parallel component of force parallel to the contact surfaces, and the two components of force each is smaller than the external force. The zigzag structures of the blocking strips 2 enable the external force to be decomposed into two components of force smaller than the external force and facing other directions so that the minimum stress for causing cracks may not be achieved, thereby alleviating the situation of causing cracks in the processes of cutting, fetching-placing or transferring the display substrate. If the external force is so large that the components of force generated by decomposing the applied external force can still reach the critical stress for the display substrate to crack, the crack caused by a component of force will extend along the direction of the component of force. When the crack extends and meets the next zigzag structure, the component of force will be decomposed again into two sub-components of force which are relatively small and have other directions. So the impact force and energy of the crack will be dispersed and weakened gradually, and the crack is easy to consume. So it is hard for the crack to develop and extend. Moreover, since the blocking strips 2 have the zigzag structures, the actual length of the blocking strips 2 with the zigzag structures along the extension direction of the blocking strips 2 within the plane of the display substrate is greater compared with the linear distance. Since the cracks will consume the energy of the external force in the process of extension, the blocking strips 2 will consume more energy of the external force if its actual length is greater, which can effectively prevent the propagation of the cracks so that the linear distance of the cracks developed within the plane of the display substrate is very short.

Therefore, in the above display substrate, the blocking strips 2 having the zigzag structures can effectively alleviate the situation that the peripheral side surface of the display substrate is cracked by external force during the processes of cutting, fetching-placing, or transferring the substrate, and also effectively prevent crack propagation and improve panel display quality when the external force is too large.

In particular, the device layer may include metal or semiconductor layers such as a gate, an active layer, and source-drain electrode layers of a thin film transistor, and the insulation layer may include an interlayer insulation layer among layers of the device layer and a gate insulation layer. The blocking dams can be installed in the interlayer insulation layer or in the gate insulation layer. Optionally, in order to strengthen the blocking effect of external force, the blocking dams can be set in both the interlayer insulation layer and the gate insulation layer.

Specifically, in the above display substrate, the size 'd' of each blocking strip 2 in the direction perpendicular to the side edges 11 is 40 μm to 60 μm that is, in the side portion of the side edge 11 where the blocking dam is provided, the length of the linear distance from one end to the other end of each blocking strip 2 is set to be 40 μm to 60 μm along the direction perpendicular to the side edge 11. Since each blocking strip 2 has the zigzag structure, the actual length of each blocking strip 2 must be greater than the linear distance from one end to the other end. According to the actual design requirements, the linear distance from one end to the other end of each blocking strip 2 is selected in the range of 40 μm to 60 μm, which can more effectively prevent crack extension and improve the display effect.

In order to enhance the blocking effect of the blocking dams as a whole, as shown in FIG. 2 and FIG. 4, in the orthographic projection of each blocking strip 2 on a plane perpendicular to the base 1 and parallel to the arrangement direction of the blocking strips 2, the orthographic projections of every two adjacent blocking strips 2 partially overlap. That is, in the plane where each blocking strip 2 is located, every two adjacent blocking strips 2 are partly staggered and overlapped with each other with no gap if they are viewed from a direction perpendicular to the arrangement direction of the blocking strips 2. In other words, in a blocking dam corresponding to an edge portion of a side edge 11 of the display substrate, orthographic projections of every two adjacent blocking strips 2 in a plane perpendicular to the base 1 and parallel to the side edge 11 partially overlap. Therefore, when the external force is applied to the side edges 11 with the blocking dams, no matter where the external force is applied to the side edges 11, the blocking strips 2 are opposite to the external force to block the external force. Therefore, the blocking effect of the blocking dams can be effectively improved. When a crack is generated, the crack propagation can be effectively blocked.

The zigzag structures of the above-mentioned blocking strips 2 can have various design options, such as follows.

An implementation

Figure 3:
FIG. 3 is a schematic diagram of force analysis of the blocking strip in FIG. 2.

As shown in FIG. 2, each zigzag structure includes at least one "S"-shaped unit strip, each "S"-shaped unit strip includes a first end 21 and a second end 22. When a zigzag structure includes a plurality of "S"-shaped unit strips, the second end 22 of the previous "S"-shaped unit strip is connected to the first end 21 of the subsequent "S"-shaped unit strip along the extension direction of the blocking strip 2, and the plurality of "S"-shaped unit strips are sequentially connected to form the zigzag structure with relatively smooth tooth tips. As shown in FIG. 3, since the outer surfaces of the "S"-shaped unit strips are curved and are not perpendicular to the external force F applied to the side edge 11, when the external force comes to the blocking strip 2, the external force F can be decomposed by the "S"-shaped unit strip into two components of force $F_1$ and $F_2$ smaller than the external force and facing other directions than the direction of the external force. Specifically, $F_1$ and $F_2$ may be two components of force along the tangential and vertical directions of the stress surfaces of the "S"-shaped unit strips. Both $F_1$ and $F_2$ are smaller than F so that the minimum stress for causing cracks may not be achieved, thereby directly preventing the generation of the cracks. In addition, even if $F_1$ and/or $F_2$ can reach the minimum stress to cause cracks along the direction of $F_1$ and/or $F_2$, the impact force of the cracks extending and meeting the next zigzag structure will be decomposed again into two sub-components of force which are relatively small and have other directions. So the impact force and energy of the cracks will be dispersed and weakened gradually, and the cracks are easy to consume. So it is hard for the cracks to develop and extend. The linear development distance perpendicular to the direction of the side edges 11 is also very short. Therefore, the propagation of the cracks can be effectively prevented so that the linear distance of the cracks developed in the plane of the display substrate is short so as to avoid affecting the display effect.

Another implementation

Figure 5:
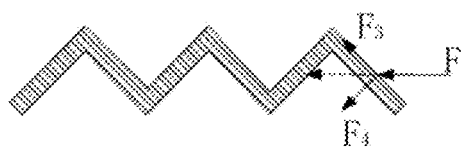
FIG. 5 is a schematic diagram of force analysis of the blocking strip in FIG. 4.

As shown in FIG. 4, each zigzag structure includes at least one "V"-shaped unit strip, each "V"-shaped unit strip includes a first free end 421 and a second free end 422. When a zigzag structure includes a plurality of "V"-shaped unit strips, the second free end 422 of the previous "V"-shaped unit strip is connected to the first free end 421 of the subsequent "V"-shaped unit strip along the extension direction of the blocking strips 2, and the plurality of "V"-shaped unit strips are sequentially connected to form the zigzag structure with relatively sharp tooth tips. As shown in FIG. 5, since the side of the "V"-shaped unit strip corresponding to the side edge 11 to which the external force is applied is an inclined surface and is not perpendicular to the external force F applied to the side edge 11, when the external force comes to the blocking strip 2, the external force F can be decomposed by the "V"-shaped unit strip into two components of force $F_3$ and $F_4$ smaller than the external force and facing other directions than the external force. Specifically, $F_3$ and $F_4$ may be two components of force in the direction along the inclined surfaces of the "V"-shaped unit strip and the direction perpendicular to the inclined surface. Both $F_3$ and $F_4$ are smaller than F so that the minimum stress for causing cracks may not be achieved, thereby directly preventing the generation of the cracks. In addition, even if $F_3$ and/or $F_4$ can reach the minimum stress to cause cracks along the direction of $F_3$ and/or $F_4$, the impact force of the cracks extending and meeting the next zigzag structure will be decomposed again into two sub-components of force which are relatively small and have other directions. So the impact force and energy of the cracks will be dispersed and weakened gradually, and the cracks are easy to consume. So it is hard for the cracks to develop and extend. The linear development distance perpendicular to the direction of the side edges 11 is also very short. Therefore, the propagation of the cracks can be effectively prevented so that the linear distance of the cracks developed in the plane of the display substrate is short so as to avoid affecting the display effect.

In the above implementations, the angle between the two oblique sides (two inclined surfaces) of each "V"-shaped unit strip is 90° to 120°. In order to make the blocking effect of the formed blocking strips 2 better, one can select the angle formed by the two oblique sides of each "V"-shaped unit strip within the range of 90° to 120° according to the actual situation.

Specifically, in order to improve the protection strength of the entire display substrate, the blocking dams may be provided on the edge portions of each of the opposite two side edges in the above-mentioned base 1, which has a better protection effect on the display substrate and can more effectively avoid cracks and improve the display effect.

In the above-mentioned blocking dams of the display substrate, the blocking strips 2 are evenly spaced, and the plurality of blocking strips 2 are arranged at equal intervals, which is beneficial to improving the blocking effect and facilitates manufacture.

Based on the same inventive concept, an embodiment of the present disclosure further provides a display panel including any one of the display substrates provided in the above embodiments.

In addition, an embodiment of the present disclosure also provides a display device including any one of the display panels provided in the embodiments.

Obviously, those skilled in the art can make various modifications and variations to the embodiments of the present disclosure without departing from the spirit and scope of the present disclosure. In this way, if these modifications and variations made to the present disclosure fall within the scope of the claims of the present disclosure and their equivalent technologies, the present disclosure also intends to include these modifications and variations.

What is claimed is:

1. A display substrate, comprising:
   a base; and
   a device layer and an insulation layer on the base;
   wherein the base comprises:
     a display area; and
     a non-display area located on a peripheral side of the display area;
   the device layer comprises a gate, an active layer, and source-drain electrode layers of a thin film transistor;
   the insulation layer comprises an interlayer insulation layer among layers of the device layer and a gate insulation layer;
   and wherein:
     at least one blocking dam for preventing crack propagation is provided in a portion, located on the non-display area, of the insulation layer, and each blocking dam corresponds to an edge portion of a side edge of the base; and
     in each edge portion, the blocking dam comprises a plurality of blocking strips arranged along an extension direction of the side edge, an extension direction of each blocking strip is perpendicular to the side edge, and each blocking strip has a zigzag structure extending along the extension direction of the each blocking strip perpendicular to the side edge.

2. The display substrate of claim 1, wherein a size of each blocking strip in the extension direction perpendicular to the side edge ranges from 40 μm to 60 μm.

3. The display substrate of claim 1, wherein orthographic projections of every two adjacent blocking strips on a plane, perpendicular to the base and parallel to the arrangement direction of the blocking strips, partially overlap.

4. The display substrate of claim 1, wherein:
   each zigzag structure comprises at least one "S"-shaped unit strip;
   each "S"-shaped unit strip comprises a first end and a second end; and
   when each zigzag structure comprises a plurality of "S"-shaped unit strips, the second end of a previous "S"-shaped unit strip is connected to the first end of a subsequent "S"-shaped unit strip along the extension direction of the blocking strips.

5. The display substrate of claim 1, wherein:
each zigzag structure comprises at least one "V"-shaped unit strip;
each "V"-shaped unit strip comprises a first free end and a second free end; and
when each zigzag structure comprises a plurality of "V"-shaped unit strips, the second free end of a previous "V"-shaped unit strip is connected to the first free end of a subsequent "V"-shaped unit strip along the extension direction of the blocking strips.

6. The display substrate of claim 5, wherein an angle formed by two oblique sides in the "V"-shaped unit strip ranges from 90° to 120°.

7. The display substrate of claim 1, wherein in the base, edge portions of each of every two opposite side edges are provided with the blocking dams.

8. The display substrate of claim 1, wherein the blocking strips are evenly spaced.

9. A display panel comprising a display substrate, wherein the display substrate comprises:
a base; and
a device layer and an insulation layer on the base;
wherein the base comprises:
a display area; and
a non-display area located on a peripheral side of the display area;
the device layer comprises a gate, an active layer, and source-drain electrode layers of a thin film transistor;
the insulation layer comprises an interlayer insulation layer among layers of the device layer and a gate insulation layer;
and wherein:
at least one blocking dam for preventing crack propagation is provided in a portion, located on the non-display area, of the insulation layer, and each blocking dam corresponds to an edge portion of a side edge of the base; and
in each edge portion, the blocking dam comprises a plurality of blocking strips arranged along an extension direction of the side edge, an extension direction of each blocking strip is perpendicular to the side edge, and each blocking strip has a zigzag structure extending along the extension direction of the each blocking strip perpendicular to the side edge.

10. The display panel of claim 9, wherein a size of each blocking strip in the extension direction perpendicular to the side edge ranges from 40 μm to 60 μm.

11. The display panel of claim 9, wherein orthographic projections of every two adjacent blocking strips on a plane, perpendicular to the base and parallel to the arrangement direction of the blocking strips, partially overlap.

12. The display panel of claim 9, wherein:
each zigzag structure comprises at least one "S"-shaped unit strip;
each "S"-shaped unit strip comprises a first end and a second end; and
when each zigzag structure comprises a plurality of "S"-shaped unit strips, the second end of a previous "S"-shaped unit strip is connected to the first end of a subsequent "S"-shaped unit strip along the extension direction of the blocking strips.

13. The display panel of claim 9, wherein:
each zigzag structure comprises at least one "V"-shaped unit strip;
each "V"-shaped unit strip comprises a first free end and a second free end; and
when each zigzag structure comprises a plurality of "V"-shaped unit strips, the second free end of a previous "V"-shaped unit strip is connected to the first free end of a subsequent "V"-shaped unit strip along the extension direction of the blocking strips.

14. The display panel of claim 13, wherein an angle formed by two oblique sides in the "V"-shaped unit strip ranges from 90° to 120°.

15. The display panel of claim 9, wherein in the base, edge portions of each of every two opposite side edges are provided with the blocking dams.

16. The display panel of claim 9, wherein the blocking strips are evenly spaced.

17. A display device comprising a display panel, wherein the display panel comprises a display substrate, and the display substrate comprises:
a base; and
a device layer and an insulation layer on the base;
wherein the base comprises:
a display area; and
a non-display area located on a peripheral side of the display area;
the device layer comprises a gate, an active layer, and source-drain electrode layers of a thin film transistor;
the insulation layer comprises an interlayer insulation layer among layers of the device layer and a gate insulation layer;
and wherein:
at least one blocking dam for preventing crack propagation is provided in a portion, located on the non-display area, of the insulation layer, and each blocking dam corresponds to an edge portion of a side edge of the base; and
in each edge portion, the blocking dam comprises a plurality of blocking strips arranged along an extension direction of the side edge, an extension direction of each blocking strip is perpendicular to the side edge, and each blocking strip has a zigzag structure extending along the extension direction of the each blocking strip perpendicular to the side edge.

18. The display device of claim 17, wherein a size of each blocking strip in the extension direction perpendicular to the side edge ranges from 40 μm to 60 μm.

19. The display device of claim 17, wherein orthographic projections of every two adjacent blocking strips on a plane, perpendicular to the base and parallel to the arrangement direction of the blocking strips, partially overlap.

20. The display device of claim 17, wherein in the base, edge portions of each of every two opposite side edges are provided with the blocking dams.

* * * * *